US008815621B2

(12) United States Patent
Ueno et al.

(10) Patent No.: US 8,815,621 B2
(45) Date of Patent: *Aug. 26, 2014

(54) METHOD OF FORMING P-TYPE GALLIUM NITRIDE BASED SEMICONDUCTOR, METHOD OF FORMING NITRIDE SEMICONDUCTOR DEVICE, AND METHOD OF FORMING EPITAXIAL WAFER

(75) Inventors: Masaki Ueno, Itami (JP); Yusuke Yoshizumi, Itami (JP); Takao Nakamura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 891 days.

This patent is subject to a terminal disclaimer.

(21) Appl. No.: 12/970,382

(22) Filed: Dec. 16, 2010

(65) Prior Publication Data
US 2011/0111578 A1 May 12, 2011

Related U.S. Application Data

(63) Continuation of application No. 12/771,018, filed on Apr. 30, 2010, now Pat. No. 7,879,636, which is a continuation of application No. PCT/JP2009/059441, filed on May 22, 2009.

(30) Foreign Application Priority Data

Oct. 7, 2008 (JP) ................................ 2008-260825

(51) Int. Cl.
*H01L 21/00* (2006.01)
(52) U.S. Cl.
USPC .................. 438/38; 438/45; 438/46; 438/47; 438/500; 438/507; 438/508

(58) Field of Classification Search
USPC ........................ 438/38, 45–47, 500, 507, 508
See application file for complete search history.

(56) References Cited

U.S. PATENT DOCUMENTS

| 5,618,579 A | 4/1997 | Boire et al. |
| 5,902,393 A | 5/1999 | Nido et al. |

(Continued)

FOREIGN PATENT DOCUMENTS

| DE | 10134181 A1 | 2/2002 |
| JP | 05-183189 | 7/1993 |

(Continued)

OTHER PUBLICATIONS

Eiting et al., "Growth of low resistivity p-type GaN by metal organic chemical vapour deposition", Electronics Letters, vol. 33, No. 23, pp. 1987-1989 (1997).

(Continued)

*Primary Examiner* — Bac Au
(74) *Attorney, Agent, or Firm* — Venable LLP; Michael A. Sartori; Steven J. Schwarz

(57) ABSTRACT

A method of forming a p-type gallium nitride based semiconductor without activation annealing is provided, and the method can provide a gallium nitride based semiconductor doped with a p-type dopant. A GaN semiconductor region 17 containing a p-type dopant is formed on a supporting base 13 in a reactor 10. An organometallic source and ammonia are supplied to the reactor 10 to grow the GaN semiconductor layer 17 on a GaN semiconductor layer 15. The GaN semiconductor is doped with a p-type dopant. Examples of the p-type dopant include magnesium. After the GaN semiconductor regions 15 and 17 are grown, an atmosphere 19 containing at least one of monomethylamine and monoethylamine is prepared in the reactor 10. After the atmosphere 19 is prepared, a substrate temperature is decreased from the growth temperature of the GaN semiconductor region 17. When the substrate temperature is lowered to room temperature after this film formation, a p-type GaN semiconductor 17a and an epitaxial wafer E has been fabricated.

31 Claims, 8 Drawing Sheets

(56) References Cited

U.S. PATENT DOCUMENTS

| | | |
|---|---|---|
| 6,017,774 A | 1/2000 | Yuasa et al. |
| 6,043,140 A | 3/2000 | Kawai et al. |
| 6,242,045 B1 | 6/2001 | Proscia et al. |
| 6,413,312 B1 | 7/2002 | Kawai et al. |
| RE38,613 E | 10/2004 | Kawai et al. |
| 7,056,755 B1 | 6/2006 | Kamei et al. |
| 7,879,636 B2 * | 2/2011 | Ueno et al. .................. 438/38 |
| 2006/0183260 A1 | 8/2006 | Kamei et al. |

FOREIGN PATENT DOCUMENTS

| | | |
|---|---|---|
| JP | 08-115880 | 5/1996 |
| JP | 09-199758 | 7/1997 |
| JP | 10-004211 | 1/1998 |
| JP | 10-135575 | 5/1998 |
| JP | 2001-119065 | 4/2001 |
| JP | 2001-156003 | 6/2001 |
| JP | 2001-298214 | 10/2001 |
| JP | 2003-178987 | 6/2003 |
| JP | 2004-146525 | 5/2004 |
| JP | 2009-184836 | 8/2009 |
| KR | 2009-0084715 | 8/2009 |
| TW | I252501 | 4/2006 |
| TW | 200625410 | 7/2006 |

OTHER PUBLICATIONS

Office Action in Taiwanese Patent Application No. 098117535, dated Feb. 18, 2013.

European Search Report in European Patent Application No. 09819023.4-1552, dated Oct. 21, 2013.

European Office Action in European Patent Application No. 09 819 023.4, dated Jun. 11, 2014.

* cited by examiner (a)

(b)

(a)

(b)

METHOD OF FORMING P-TYPE GALLIUM NITRIDE BASED SEMICONDUCTOR, METHOD OF FORMING NITRIDE SEMICONDUCTOR DEVICE, AND METHOD OF FORMING EPITAXIAL WAFER

CROSS REFERENCE TO RELATED APPLICATIONS

This is a continuation of U.S. patent application Ser. No. 12/771,018 filed on Apr. 30, 2010, which is a continuation of International Patent Application PCT application No. PCT/JP2009/059441 filed on May 22, 2009, claiming the benefit of priorities from Japanese Patent application No. 2008-260825 filed on Oct. 7, 2008, and incorporated by reference in their entirety.

TECHNICAL FIELD

The present invention relates to a method of forming a p-type gallium nitride based semiconductor, a method of forming a nitride semiconductor device, and a method of forming an epitaxial wafer.

BACKGROUND ART

Patent Literature 1 discloses the method of making a p-type gallium nitride compound semiconductor by use of activation annealing, and a gallium nitride compound semiconductor doped with a p-type dopant is annealed in nitrogen atmosphere.

Patent Literature 2 discloses the method of growing a low-resistance p-type gallium nitride compound semiconductor by vapor phase deposition. In this method, after the p-type gallium nitride semiconductor is grown, the substrate temperature is decreased to 700° C. in an atmosphere composed of ammonia and hydrogen and then decreased from 700° C. in an atmosphere composed of an organic nitrogen compound and nitrogen. Tertiary butylamine, ethyl azide, and dimethylhydrazine are used as organic nitrogen compounds.

Patent Literature 3 discloses the method of making a nitride compound semiconductor. In this method, after a stack structure including a p-type gallium nitride semiconductor layer containing an acceptor is grown, the stacked structure is cooled in an atmosphere composed of a nitrogen source which releases no dissociated hydrogen. The nitrogen sources include amine compounds, hydrazine compounds and azide compounds, such as trimethylamine, dimethylamine, triethylamine, diethylamine, phenylmethylamine, and trimethylhydrazine.

Patent Literature 4 discloses the method of forming a p-type gallium nitride semiconductor. In the period to decrease the temperature of a p-type gallium nitride semiconductor, an atmosphere containing hydride gas is changed to an atmosphere containing hydrogen or nitrogen at a temperature equal to or higher than 400° C. Ammonia is used as the hydride gas.

CITATION LIST

Patent Literature

[Patent Literature 1] Japanese Unexamined Patent Application Publication No. 05-183189.
[Patent Literature 2] Japanese Unexamined Patent Application Publication No. 09-199758.
[Patent Literature 3] Japanese Unexamined Patent Application
[Patent Literature 4] Japanese Unexamined Patent Application Publication No. 08-115880.

SUMMARY OF INVENTION

Technical Problem

The activation annealing is employed in Patent Literature 1, whereas temperature decrease in a desired atmosphere is carried out after the growth of films in each of Patent Literatures 2 to 4.

In Patent Literatures 2 and 4, temperature decrease of the region of gallium nitride semiconductor is initiated in an ammonia-containing atmosphere in order to prevent dissociation of nitrogen from the gallium nitride semiconductor. But, in the ammonia atmosphere, decomposition of ammonia produces active hydrogen, which prevents hydrogen atoms from dissociating from the semiconductor.

In Patent Literature 3, decreasing the temperature of the stack structure is carried out in the atmosphere of a nitrogen source from which hydrogen is not dissociated. In this regard, Patent Literature 3 is different from Patent Literatures 2 and 4. Nitrogen sources for use in Patent Literature 3 are amine compounds, hydrazine compounds and azide compounds, such as trimethyl-amine, dimethylamine, trimethylamine, diethylamine, phenylmethylamine, and trimethylhydrazine. The use of the above organic compounds, however, decreases the concentration of active nitrogen in the atmosphere, so that nitrogen is dissociated from the surface of the nitride semiconductor.

It is an object of the present invention to provide a method of forming a p-type gallium nitride based semiconductor and the method can provide gallium nitride based semiconductor containing a p-type dopant without using annealing for activation. It is another object of the present invention to provide a method of forming a nitride semiconductor device, and it still is another object of the present invention to provide a method of forming an epitaxial wafer.

Solution to Problem

One aspect of the present invention is a method of forming a p-type gallium nitride based semiconductor. This method comprises the steps of: (a) forming a gallium nitride based semiconductor region, the gallium nitride based semiconductor region containing a p-type dopant; and (b) after forming the gallium nitride based semiconductor region, decreasing a substrate temperature from a growth temperature in an atmosphere, the gallium nitride based semiconductor region being grown at the growth temperature, and the atmosphere containing at least one of monomethylamine and monoethylamine.

Another aspect of the present invention is a method of forming a nitride semiconductor device. This method comprises the steps of: (a) forming a gallium nitride based semiconductor region on a substrate in a reactor, the gallium nitride based semiconductor region containing a p-type dopant; and (b) after the gallium nitride based semiconductor region, decreasing a temperature of the substrate in the reactor in order to take out the substrate from the reactor, while supplying gas to the reactor, the gas containing at least one of monomethylamine and monoethylamine.

Furthermore, yet another aspect of the present invention is a method of forming an epitaxial wafer for a nitride semiconductor device. This method comprises the steps of: (a) forming a semiconductor region on a substrate in a reactor, the semiconductor region comprising at least one gallium nitride based semiconductor layer; and (b) after the gallium nitride based semiconductor region, decreasing a substrate temperature while supplying gas to the reactor, in order to take out the substrate from the reactor, the gas containing at least one of monomethylamine and monoethylamine, the semiconductor region comprising a gallium nitride based semiconductor region, and the gallium nitride based semiconductor region containing a p-type dopant.

According to these methods, the substrate temperature is decreased after forming the gallium nitride based semiconductor that contains a p-type dopant, resulting in providing the gallium nitride based semiconductor region having p-type conductivity. Therefore, the annealing of the gallium nitride based semiconductor region for dopant activation is not required.

Monomethylamine and monoethylamine are decomposed to produce active $NH_2$, whereas $NH_3$ is more stable compared with these amines. Accordingly, the decomposition of $NH_3$ does not easily occur during decrease of the substrate temperature. For example, based on the dissociation constants of reaction at 500° C., the rate of generation of $NH_2$ from monomethylamine is at least one million times as large as the rate of generation of $NH_2$ from $NH_3$. As a result, the atmosphere of monomethylamine and monoethylamine can more efficiently suppress the decomposition of the nitride semiconductor, as compared with the atmosphere of $NH_3$.

Monomethylamine and monoethylamine are decomposed to produce a methyl or ethyl group. In contrast, $NH_3$ is decomposed to produce not only $NH_2$ but also active hydrogen (H). The decomposition of monomethylamine and monoethylamine generates a methyl group and an ethyl group, but not hydrogen. Accordingly, the use of monomethylamine and monoethylamine can prevent the surface of the gallium nitride based semiconductor from being exposed to active hydrogen.

It is presumed that hydrogen may be also produced from $NH_2$ in the atmosphere, like the decomposition of $NH_3$. A larger amount of hydrogen is however present in the $NH_3$ atmosphere. It is believed that hydrogen is not readily released from the semiconductor in the atmosphere and that the concentration of Mg bound to hydrogen is still high even after the temperature decrease.

In decreasing the substrate temperature to a temperature at which the nitride semiconductor is unloaded from a reactor after the growth, the bond between the p-type dopant and hydrogen is broken to activate the p-type dopant therein.

In the method according to the present invention, no hydrogen gas is supplied in the step of decreasing the substrate temperature.

According to this method, simultaneous supply of hydrogen with monomethylamine and monoethylamine at high temperature may increase the decomposition rate of the nitride semiconductor. Further, the supply of hydrogen gas interferes with the release of hydrogen from the gallium nitride based semiconductor region in which a p-type dopant is incorporated.

In the method according to the present invention, no $NH_3$ is supplied in the step of decreasing the substrate temperature. According to this method, decreasing the temperature in the $NH_3$-containing atmosphere does not contribute to the activation of the gallium nitride based semiconductor region in which a p-type dopant is incorporated.

In the method according to the present invention, the molar ratio of the supplied monomethylamine and monoethylamine to a total flow is 3% or less in the step of decreasing the substrate temperature. This method does not need supply of large amounts of monomethylamine and monoethylamine because these amines have high decomposition efficiencies, which are in contrast to $NH_3$.

In the method according to the present invention, the molar ratio of the supplied at least one of monomethylamine and monoethylamine to a total flow is 0.00001% or more. According to this method, supplying at least one of monomethylamine and monoethylamine at a molar proportion of not less than 0.00001% can suppress the decomposition of nitride semiconductor and activate the p-type dopant.

In the method according to the present invention, the partial pressure of the supplied at least one of monomethylamine and monoethylamine is 3 kPa or less. Also, in the method according to the present invention, the partial pressure of the supplied at least one of monomethylamine and monoethylamine is 0.01 Pa or more.

In the method according to the present invention, each of monomethylamine and monoethylamine has a water content of 50 ppm or less. According to this method, when the water content is not more than 50 ppm, the practical effect on the activation is not caused by oxygen produced by the decomposition of the contained water.

In the method according to the present invention, the p-type dopant comprises at least one of magnesium and zinc. Further, in the method according to the present invention, the gallium nitride based semiconductor region is formed by metal-organic chemical vapor deposition. Furthermore, in the method according to the present invention, the atmosphere further comprises nitrogen in the step of decreasing the substrate temperature.

The method according to the present invention may further include steps of, after the step of decreasing the temperature of the substrate, decreasing a temperature in the reactor while supplying nitrogen to the reactor without supply of monomethylamine and monoethylamine; and, after the step of decreasing the temperature in the reactor, taking out the substrate from the reactor. Further, decreasing the temperature in the reactor is performed after the temperature of the substrate reaches 500° C. According to this method, the atmosphere has no effect on the activation and the surface roughness of the gallium nitride based semiconductor at a substrate temperature of not more than 500° C.

The method according to the present invention may further comprises a step of growing an active layer prior to growing the gallium nitride based semiconductor region, the active layer comprising gallium nitride based semiconductor. The active layer is provided between the gallium nitride based semiconductor region and an n-type gallium nitride based semiconductor region. The active layer emits light in response to charge injection from the gallium nitride based semiconductor region and the n-type gallium nitride based semiconductor region.

This method can provide a p-type gallium nitride based semiconductor region suitable for a light-emitting device.

In the method according to the present invention, the active layer comprises a well layer, and the well layer is grown at a growth temperature in a range of 700° C. to 750° C. This method can provide a light-emitting device having an active layer which can emits a long wavelength light. If the growth temperature of this active layer is lower than an annealing temperature for the activation annealing, the activation annealing can not be applied thereto, but the method according to the present invention can provide an excellent p-type gallium nitride based semiconductor region.

In yet another aspect of the present invention, the nitride semiconductor device may comprise a semiconductor optical device. The semiconductor region includes an active layer that can emit light in response to charge injection. This method can provide an excellent p-type gallium nitride based semiconductor region for a semiconductor optical device.

In the method according to the present invention, the gallium nitride based semiconductor region is exposed to the gas atmosphere. The method may further include a step of forming an electrode in contact with the gallium nitride based semiconductor region. This method can form an electrode on a gallium nitride based semiconductor region having an excellent surface morphology.

The foregoing and other objects, features, and advantages of the present invention will become more readily apparent from the following detailed description of a preferred embodiment of the invention, which proceeds with reference to the accompanying drawings Advantageous Effects of Invention As described above, the present invention provides the method of forming a p-type gallium nitride based semiconductor, the method of forming a nitride semiconductor device, and the method of forming an epitaxial wafer. These methods can provide a gallium nitride based semiconductor containing a p-type dopant activated without annealing for the activation.

DESCRIPTION OF EMBODIMENTS

Figure 1:
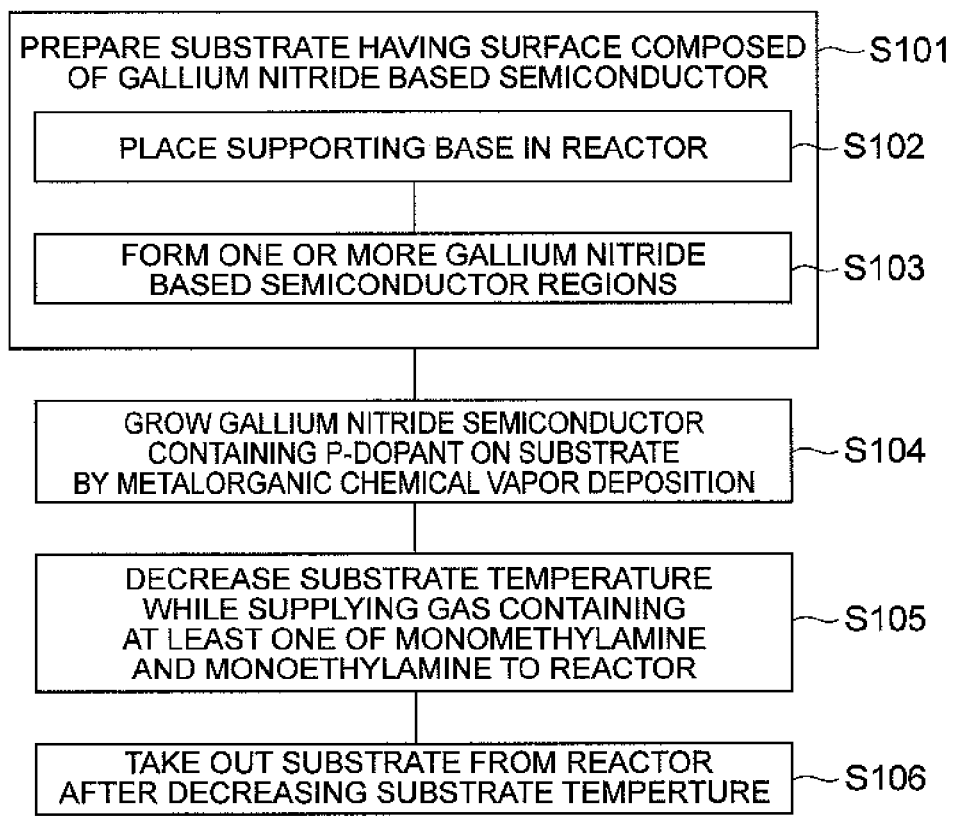
FIG. 1 is a flow chart illustrating primary steps in the method of forming a p-type gallium nitride based semiconductor, the method of forming a nitride semiconductor device, and the method of forming an epitaxial wafer according to an embodiment of the invention.

The teaching of the present invention can readily be understood from the following detailed description with reference to the accompanying drawings by way of examples. Embodiments according to a group III nitride semiconductor device and an epitaxial wafer of the present invention will be described with reference to the accompanying drawings. The same components are designated by the same reference numerals, wherever possible.

Figure 2:
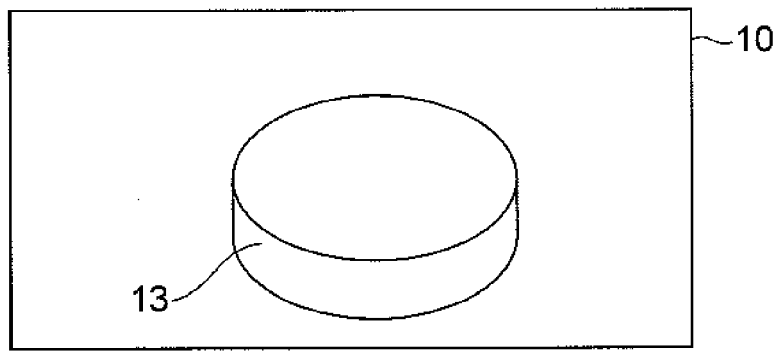
FIG. 2 is a view including schematic diagrams that show products in the primary steps.
Figure 2:
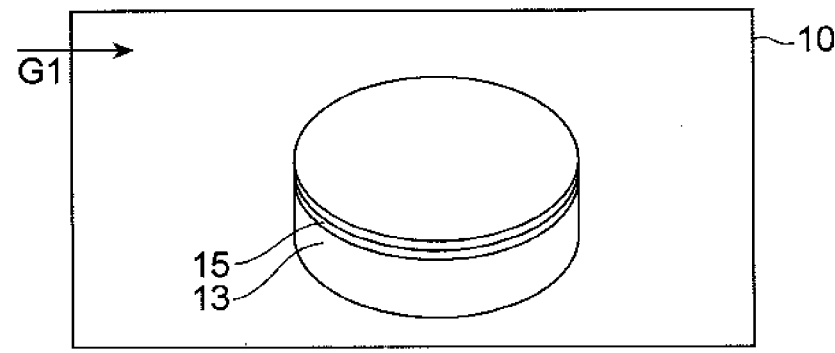
Figure 2:
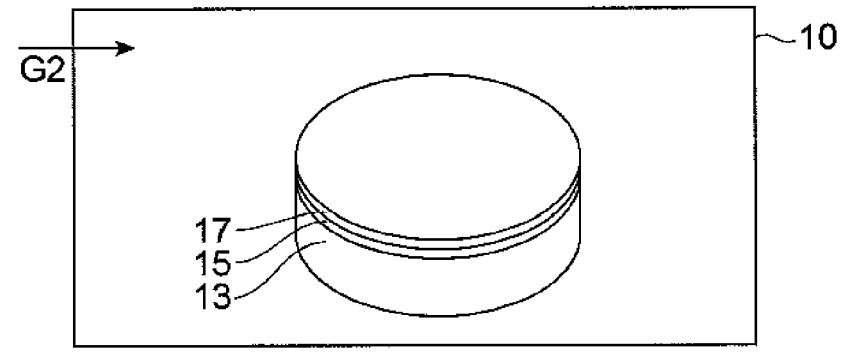
Figure 2:
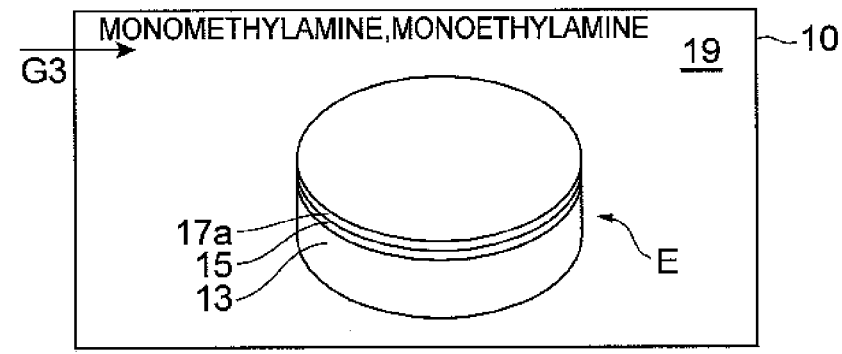

FIG. 1 is a flow chart illustrating primary steps in the method of making a p-type gallium nitride based semiconductor, the method of making a nitride semiconductor device, and the method of making an epitaxial wafer according to an embodiment of the invention. FIG. 2 is a view including schematic diagrams of products in the respective primary steps.

In Step S101, a substrate 11 is prepared, and the substrate 11 has a surface composed of gallium nitride based semiconductor. The substrate 11 includes a supporting base 13 and a gallium nitride based semiconductor layer 15 grown on the supporting base. The substrate 11 is formed as described below. First, as shown in Part (a) of FIG. 2, a supporting base 13 is prepared. The supporting base 13 encompasses, for example, a sapphire substrate and a GaN substrate. In Step S102, the supporting base 13 is placed on a susceptor 10 in a reactor for metal-organic chemical vapor deposition.

If needed, the supporting base 13 is heat-treated. After the heat treatment, one or more gallium nitride based semiconductor regions are grown thereon. For example, as shown in Part (b) of FIG. 2, in Step S103, an organometallic source and ammonia are supplied to the reactor 10 to grow a gallium nitride based semiconductor layer 15 on the supporting base 13. In the embodiment, a source gas G1, which contains trimethylgallium, ammonia and silane, is supplied to the reactor 10 to grow an n-type GaN layer.

After the above gallium nitride based semiconductor regions are grown on the supporting base 13, in Step S104, a gallium nitride based semiconductor region 17 containing a p-dopant is grown in the reactor 10. For example, as shown in Part (c) of FIG. 2, an organometallic source and ammonia are supplied to the reactor 10 to grow the gallium nitride based semiconductor layer 17 on the gallium nitride based semiconductor layer 15. This gallium nitride based semiconductor is doped with a p-type dopant. Such a p-type dopant encompasses, for example, magnesium (Mg) and zinc (Zn). Although the p-type dopant is incorporated in this as-grown gallium nitride based semiconductor, the electric resistance of the gallium nitride based semiconductor is high without the activation annealing Most of the p-type dopant atoms in the gallium nitride based semiconductor are bound to hydrogen, so that the p-type dopant atoms are not activated. This phenomenon occurs, for example, in gallium nitride based semiconductors grown by metal-organic chemical vapor deposition. In the embodiment, a source gas G2 containing trimethylgallium (TMG), ammonia ($NH_3$) and cyclopentadienyl-magnesium ($Cp_2Mg$) is supplied to the reactor 10 to grow a p-type GaN layer. The p-type GaN layer may include not only a single p-type dopant (e.g. magnesium) but also any other p-type dopant (e.g. zinc).

After the gallium nitride based semiconductor regions 15 and 17 are grown, in Step S105, as shown in Part (d) of FIG. 2, atmosphere 19 containing at least one of monomethylamine and monoethylamine is prepared in the reactor 10. This atmosphere 19 can include nitrogen, if needed. In Step S105, after the atmosphere 19 has been provided, the substrate temperature is decreased from the growth temperature of the gallium nitride based semiconductor region 17.

According to this method, the p-type dopant in the gallium nitride based semiconductor region 17 is activated during the period of the temperature decrease of the substrate which is carried out after growth of the gallium nitride based semiconductor region 17 containing a p-type dopant, resulting in providing the gallium nitride based semiconductor region 17a with p-type conductivity. Accordingly, separate activation annealing to activate the p-type dopant in the gallium nitride based semiconductor region 17 is not required. After the growth, when the substrate temperature is decreased to room temperature, the fabrication is completed to form a p-type gallium nitride based semiconductor 17a and an epitaxial wafer E.

Monomethylamine and monoethylamine are supplied to the reactor 10 in the step of decreasing the temperature. Then, monomethylamine and monoethylamine are decomposed to produce active $NH_2$. In contrast, $NH_3$ is more stable than these amines, so that the decomposition of $NH_3$ does not easily occur in the temperature decreasing step. For example, based on the dissociation constants of reaction at 500° C., the rate of generation of $NH_2$ from monomethylamine is at least one million times as large as the rate of generation of $NH_2$ from $NH_3$. As a result, the atmosphere of monomethylamine and monoethylamine can more efficiently suppress the decomposition of the nitride semiconductor, when compared with the atmosphere of $NH_3$.

Monomethylamine and monoethylamine are decomposed to produce methyl and ethyl groups, respectively. In contrast, $NH_3$ is decomposed to produce not only $NH_2$ but also active hydrogen (H). Although the decomposition of monomethylamine and monoethylamine generates a methyl group and an ethyl group, respectively, the amines does not generate any active hydrogen. Accordingly, the use of monomethylamine and monoethylamine can prevent affect active hydrogen from affecting the surface of the nitride semiconductor.

It is presumed that hydrogen may be produced from the decomposition of $NH_2$ in the atmosphere, like the decomposition of $NH_3$. The amount of hydrogen in the $NH_3$ atmosphere however is larger than the amount in the $NH_2$ atmosphere produced from the amines described above, which may reveal that hydrogen is not readily released from the semiconductor and that the concentration of Mg bound to hydrogen is still high after the cooling.

After the growth, while the temperature of the epitaxial wafer is lowered to a temperature at which the nitride semiconductor can be taken out from the reactor 10, the bond between hydrogen and the p-type dopant can be broken to activate the p-type dopant therein.

In this method, hydrogen gas is not supplied in the step of decreasing the substrate temperature. Simultaneous supply of hydrogen with monomethylamine and monoethylamine at high temperature may increase the rate of decomposition of the nitride semiconductor. Furthermore, the supply of hydrogen gas interferes with the release of hydrogen from the gallium nitride based semiconductor region 17 doped with a p-type dopant.

$NH_3$ is not supplied in the step of decreasing the substrate temperature. Lowering the temperature of an epitaxial wafer in an $NH_3$-containing atmosphere prevents the activation of the gallium nitride based semiconductor region that contains a p-type dopant.

For example, the molar proportion of the amount of the supplied at least one of monomethylamine and monoethylamine in the total flow may be 3% or less in the step of decreasing the substrate temperature. Since monomethylamine and monoethylamine have high decomposition efficiencies, supply of a large amount of these amines is not required, which is in contrast to $NH_3$. On the contrary, the supply amount of $NH_3$ is, for example, about 12%. In addition, the proportion of the molar amount of the supplied at least one of monomethylamine and monoethylamine in the total flow may be not less than 0.00001%. The supply of monomethylamine and monoethylamine having a molar proportion of not less than 0.00001% can suppress the decomposition of nitride semiconductor, activate the p-type dopant, and reduce the occurrence of surface roughness.

The molar partial pressure of the supplied at least one of monomethylamine and monoethylamine may be 3 kPa or less. In addition, the molar partial pressure of the supplied at least one of monomethylamine and monoethylamine may be 0.01 Pa or more.

The water content of monomethylamine and monoethylamine may be not more than 50 ppm. At this inclusion level of water, oxygen produced by the decomposition of the contained water has practically no effect on the activation. Since the contained water produces oxygen, its appropriate control is required.

If needed, after the decrease of the substrate temperature to a temperature at which the decomposition of nitrogen from the surface of the gallium nitride based semiconductor becomes sufficiently low, the following step may be performed prior to taking out the substrate 11 from the reactor 10: decreasing the temperature of the reactor 10 while supplying nitrogen to the reactor 10 without supply of monomethylamine and monoethylamine. It is thought that 500° C. is in a range of temperature at which the decomposition of nitrogen from the surface of the gallium nitride based semiconductor is sufficiently reduced. At a substrate temperature below 500° C., the atmosphere has only a small effect on the activation and the surface roughness of the gallium nitride based semiconductor. The above steps can complete the fabrication of an epitaxial wafer including a p-type gallium nitride based semiconductor region.

The epitaxial wafer may include an active layer for a semiconductor optical device. The active layer is provided between a p-type gallium nitride based semiconductor region and an n-type gallium nitride based semiconductor region, and is composed of a gallium nitride based semiconductor. In an embodiment, a step of forming an active layer may be performed prior to the growth of the gallium nitride based semiconductor region. The active layer emits light in response to charge injection from the p-type gallium nitride based semiconductor region and the n-type gallium nitride based semiconductor region. The method according to the embodiment can provide an excellent p-type gallium nitride based semiconductor region for the optical device.

Example 1

In this example, a sapphire substrate was prepared. The pressure of a reactor for metal-organic chemical vapor deposition was kept at 100 kPa. The surface of the sapphire substrate was heat-treated at 1000° C. while hydrogen ($H_2$) and nitrogen ($N_2$) was supplied to the reactor. This cleaning period of time was, for example, about 10 minutes. After the cleaning, a low-temperature buffer layer was grown on the sapphire substrate. This buffer layer was composed of GaN. In order to grow the buffer layer, hydrogen, nitrogen, ammonia and TMG were supplied to the reactor at a substrate temperature of 470° C. The thickness of the GaN layer was 25 nm.

After growing the low-temperature buffer layer, the substrate temperature was raised to 1150° C. After raising the temperature, an n-type GaN layer was grown on the buffer layer. In order to grow the n-type GaN layer, hydrogen, nitrogen, ammonia, TMG and monomethylsilane were supplied to the reactor. The thickness of the Si-doped GaN layer was 3 μm.

After growing the n-type GaN layer thereon, the substrate temperature was decreased to 1000° C. After decreasing the temperature, a p-type GaN layer was grown on the n-type GaN layer. Hydrogen, nitrogen, ammonia, TMG and $Cp_2Mg$ were supplied to the reactor to grow the GaN p-type layer. The thickness of the Mg-doped GaN layer was 50 nm.

After growing the p-type GaN layer thereon, the atmosphere of the reactor was changed to monomethylamine and nitrogen. After the atmosphere change, the substrate temperature was decreased from 1000° C. The supply of monomethylamine and nitrogen was continued until the substrate temperature reached 500° C. A number of flow rates of monomethylamine were used, for example, in a range of 1 to 10 sccm. After decreasing the substrate temperature to 500° C., the atmosphere of the reactor was changed to nitrogen. After decreasing the substrate temperature to room temperature, an epitaxial wafer "A" was unloaded from the reactor.

After a gallium nitride based semiconductor layer was grown on a sapphire substrate in a similar way as described above, the atmosphere of the reactor was changed to ammonia, hydrogen and nitrogen. After the change, the substrate temperature was decreased from 1000° C. The supply of ammonia and nitrogen was continued until the substrate temperature reached 500° C. After lowering the substrate temperature to 500° C., the atmosphere of the reactor was changed to nitrogen and hydrogen. The substrate temperature was decreased to room temperature, and an epitaxial wafer "C" was unloaded from the reactor.

Figure 3:
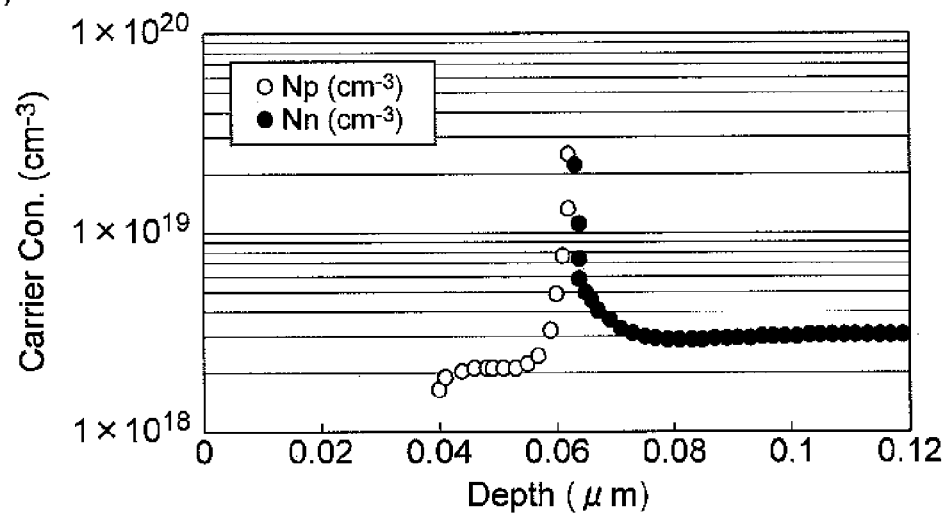
FIG. 3 is a view including the results of electrochemical C-V measurement of epitaxial wafers A and B.
Figure 3:
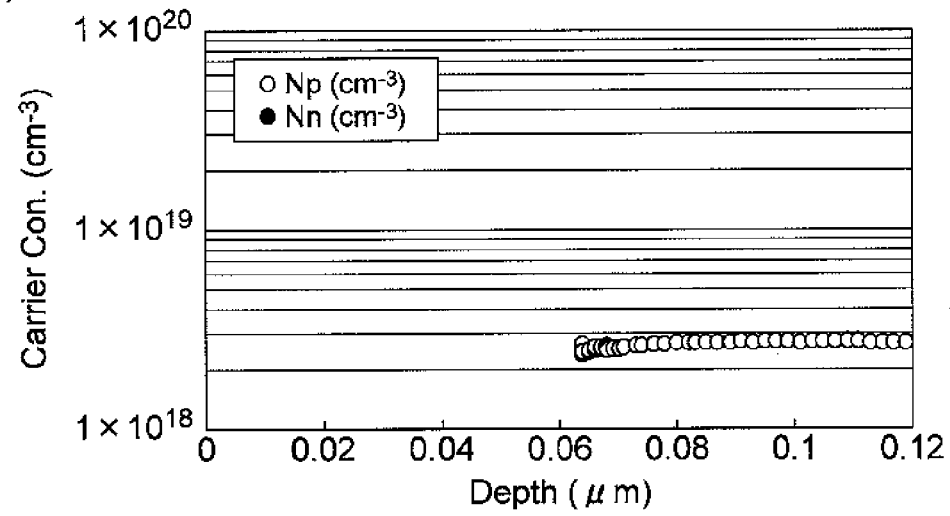

The electrochemical C-V measurement of the epitaxial wafer "A" and "C" was performed. With reference to Part (a) of FIG. 3, a p-n junction is formed at a position of 0.6 μm from the surface of the epitaxial wafer "A." The concentration of the acceptor ranges from $1.8 \times 10^{18}$ cm$^{-3}$ to $2.1 \times 10^{18}$ cm$^{-3}$. Part (b) of FIG. 3 reveals that the gallium nitride region at a depth up to 0.6 μm from the surface of the epitaxial wafer "C" has high resistance.

Figure 4:
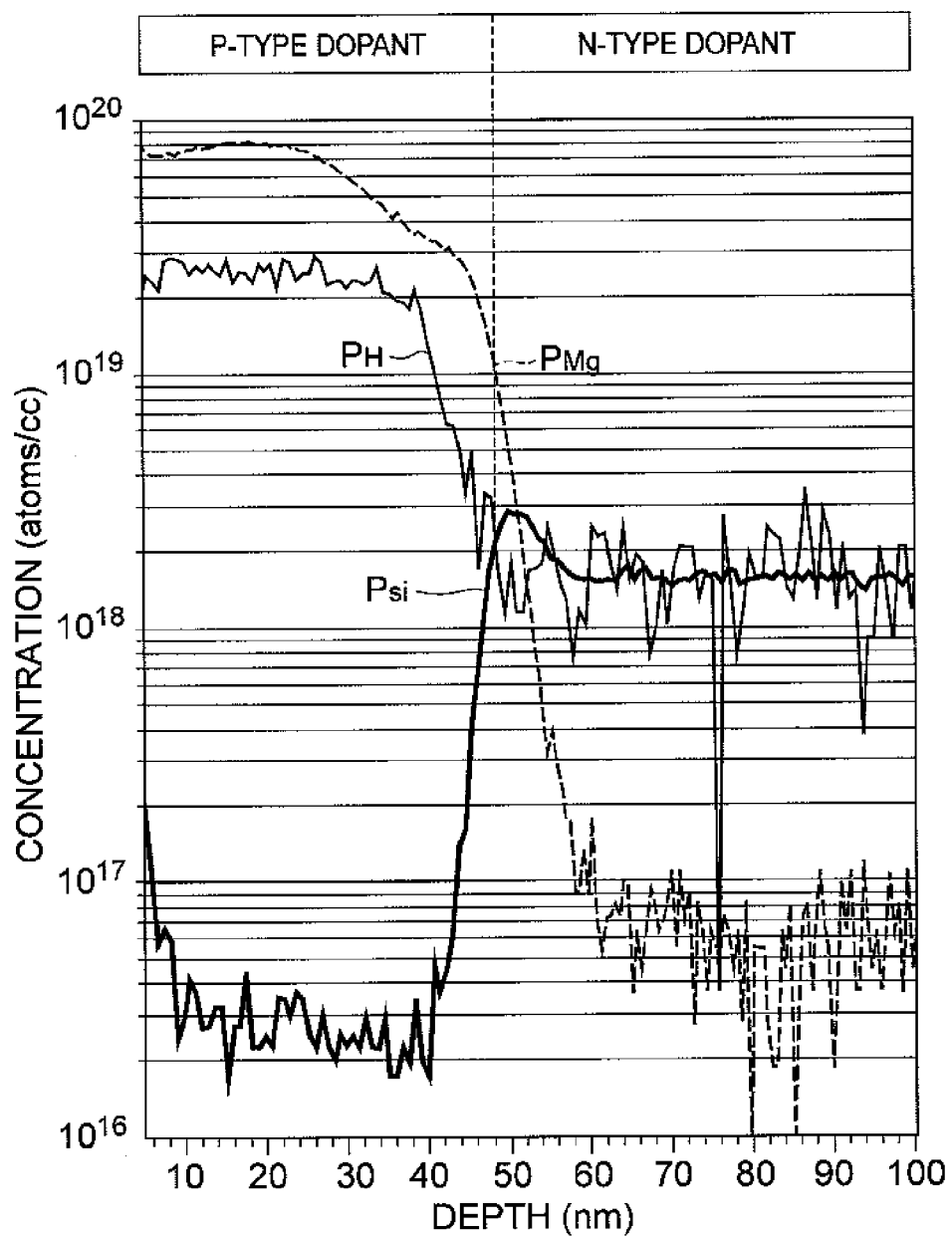
FIG. 4 is a graph showing profiles of Mg, Si and H in an epitaxial wafer A.
Figure 5:
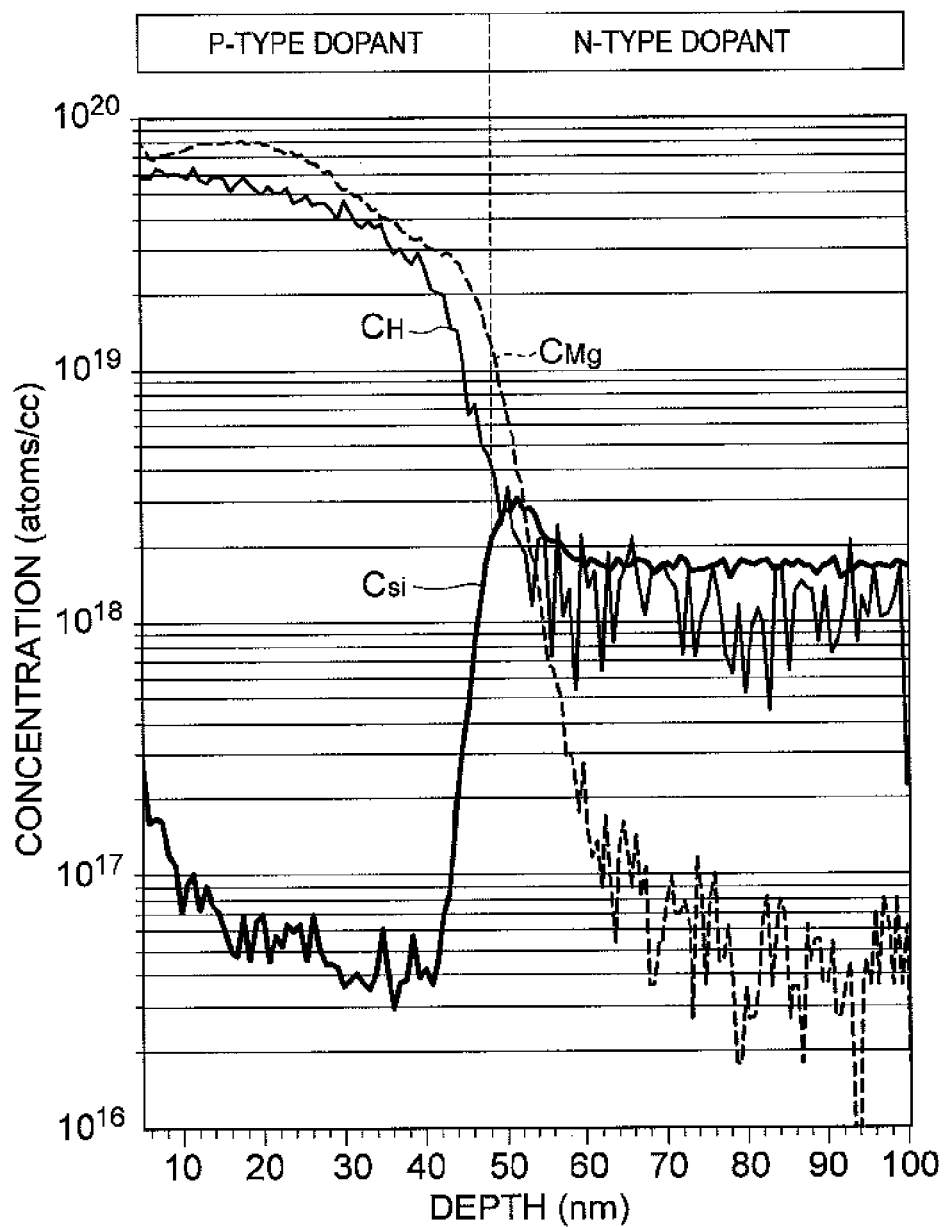
FIG. 5 is a graph of profiles of Mg, Si and H in an epitaxial wafer C.

The epitaxial wafers "A" and "C" were analyzed by secondary ion mass spectrometry (SIMS). FIG. 4 shows the profiles of Mg, Si and H in the epitaxial wafer "A." $P_{Mg}$, $P_{Si}$ and $P_H$ indicate the concentrations of Mg, Si and H, respectively. The average concentration of H at the surface region of the epitaxial wafer "A" is $2.5 \times 10^{19}$ cm$^{-3}$. The average concentration of Mg at the surface region is $6.8 \times 10^{19}$ cm$^{-3}$. On the other hand, FIG. 5 shows the profiles of Mg, Si and H of the epitaxial wafer "C." $C_{Mg}$, $C_s$, and $C_H$ indicate the concentrations of Mg, Si and H, respectively. The average concentration of H at the surface region of the epitaxial wafer "C" is $4.8 \times 10^{19}$ cm$^{-3}$. The average concentration of Mg at the surface region is $6.4 \times 10^{19}$ cm$^{-3}$.

The decrease of temperature by use of the monomethylamine atmosphere reduces the concentration of hydrogen in the gallium nitride region containing a p-type dopant. Accordingly, Part (a) of FIG. 3 reveals that a p-type region is produced in the epitaxial wafer "A" to form a p-n junction therein.

The epitaxial wafers "A" and "C" were observed with an atomic force microscope. With reference to Part (a) of FIG. 6, a "step flow" morphology was observed on the surface of the epitaxial wafer "A." With reference to Part (b) of FIG. 6, a morphology exhibiting spiral roughness was observed on the surface of the epitaxial wafer "C." The temperature decrease that is carried out in the monomethylamine atmosphere permits the formation of an excellent morphology in the surface of the gallium nitride region containing a p-type dopant. This morphology allows good electric contact at the junction between metal and the p-type gallium nitride region. Although an example including a step of decreasing the temperature using monomethylamine was described above, the same or similar results can be achieved by a step of decreasing the temperature using monoethylamine. In addition, the same or similar results can be achieved by a step of the temperature using gas including both monomethylamine and monoethylamine.

Example 2

Figure 7:
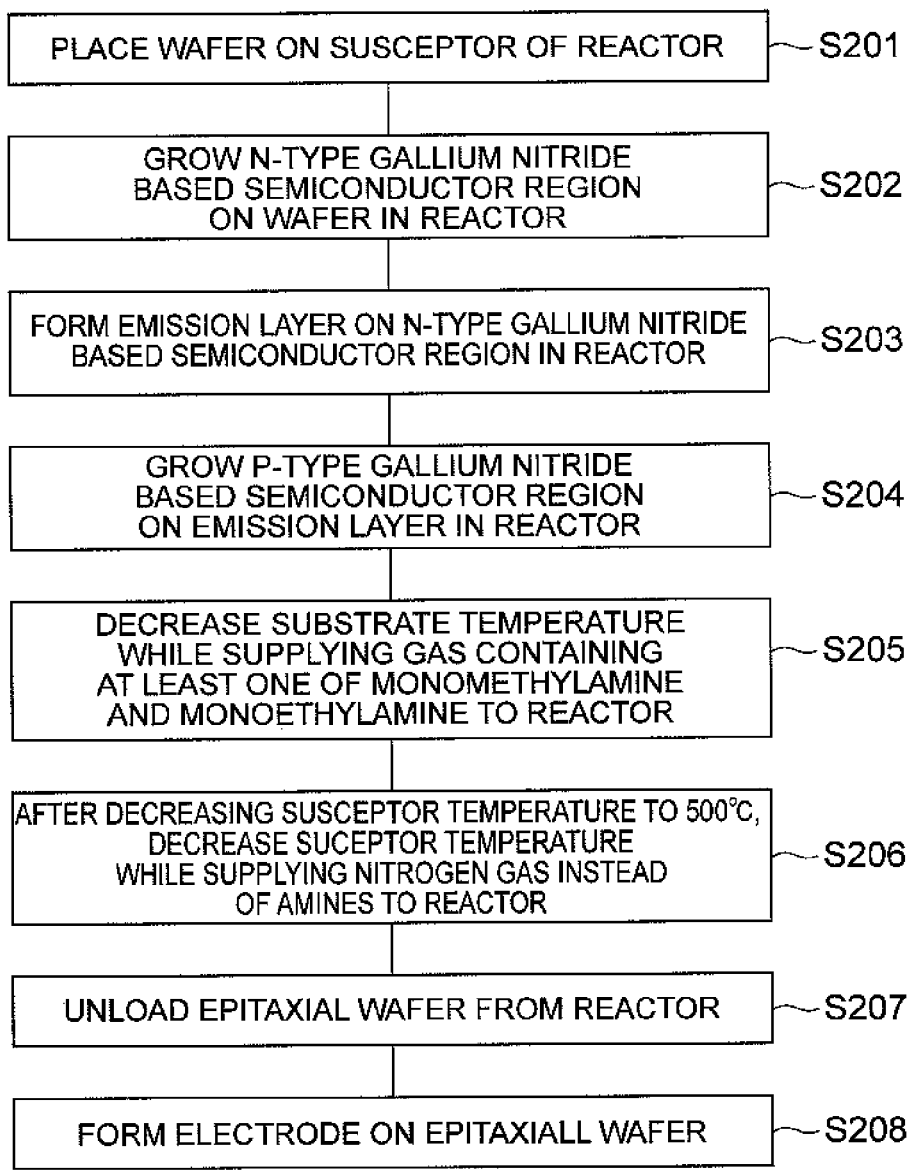
FIG. 7 is a flow chart illustrating primary steps in the method of forming a nitride semiconductor device and the method of forming an epitaxial wafer according to an embodiment of the invention.
Figure 8:
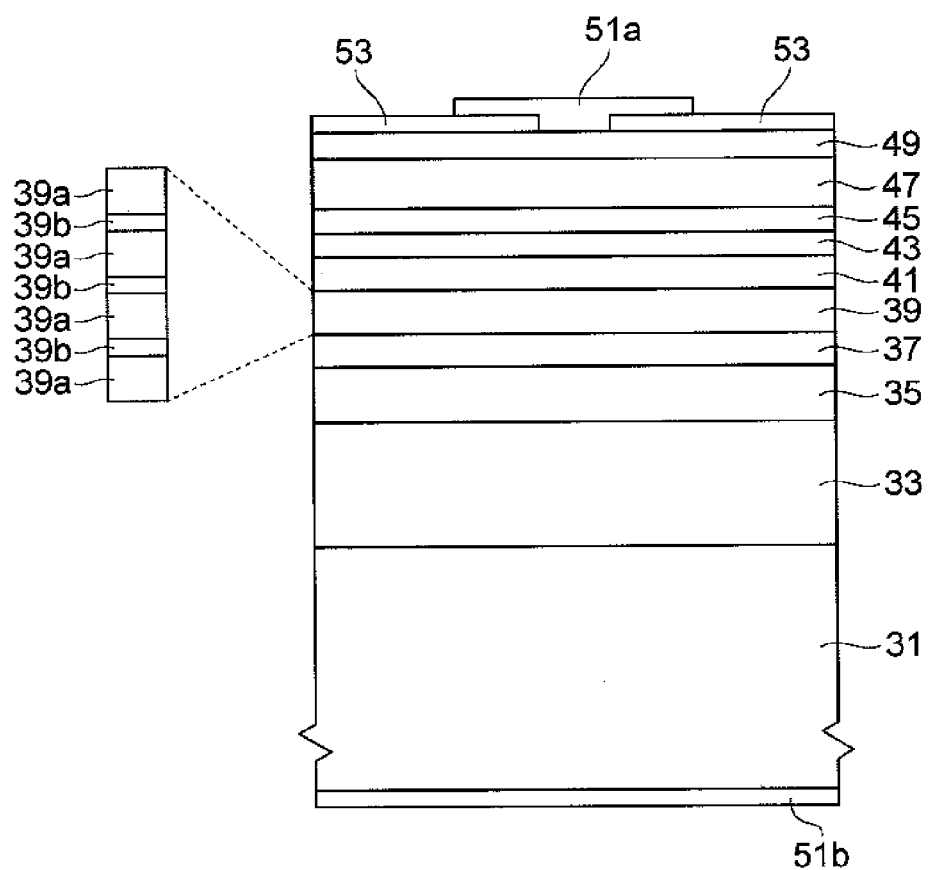
FIG. 8 is a view showing a stack structure of a nitride semiconductor device and epitaxial wafer of an embodiment of the invention.

With reference to FIGS. 7 and 8, a method of making a semiconductor laser is described below. As shown in FIG. 8, a GaN wafer 31 was prepared. In Step S201, after the GaN wafer 31 was loaded into a reactor, the GaN wafer 31 was heat-treated in an ammonia and hydrogen atmosphere. The temperature for heat-treating was 1100° C. and the period of time for the heat-treatment was about 10 minutes.

After the heat-treatment, in Step S202, an n-type gallium nitride based semiconductor region was formed thereon. The n-type gallium nitride based semiconductor region was formed, for example, by the steps as described below.

First, TMG, TMA, NH$_3$ and SiH$_4$ were supplied to the reactor to grow a Si-doped AlGaN layer 33 for a clad layer on the GaN wafer 31 at a temperature of 1150° C. The thickness of the n-type AlGaN layer 33 was 2300 nm. The composition of aluminum of the n-type AlGaN layer 33 was 0.04. Next, TMG, NH$_3$ and SiH$_4$ were supplied to the reactor to grow an n-type GaN layer 35 on the n-type AlGaN layer 33 at a temperature of 1150° C. The thickness of the n-type GaN layer 35 was 50 nm.

Subsequently, in Step S203, an emission layer was formed on the n-type gallium nitride based semiconductor region. The emission layer was formed, for example, as described below.

First, TMG, TMI and NH$_3$ were supplied to the reactor to grow an undoped InGaN layer 37 for an optical guide layer on the n-type GaN layer 35 at a temperature of 840° C. The thickness of the undoped InGaN layer 37 was 50 nm. The composition of indium in the undoped InGaN layer 37 was 0.02.

Next, an active layer 39 was grown on the optical guide layer 37. TMG and NH$_3$ were supplied to the reactor to grow an undoped GaN layer 39a for a barrier layer on the undoped InGaN layer 37 at a temperature of 870° C. The thickness of the GaN layer 39a was 15 nm. Subsequently, the temperature of the reactor was changed from 870° C. to 745° C. After the change of temperature, TMG, TMI and NH$_3$ were supplied to the reactor to grow an undoped InGaN layer 39b on the GaN layer 39a at a temperature of 745° C. The thickness of the InGaN layer 39b was 3 nm. The composition of indium in the undoped InGaN layer 39b was 0.2.

After growing the well layer 39b thereon, the temperature of the reactor was changed from 745° C. to 870° C. After the temperature change, TMG and NH$_3$ were supplied to the reactor to grow an undoped GaN layer 39a on the InGaN layer 39b at a temperature of 870° C. The thickness of the GaN layer 39a was 15 nm.

In a similar way, the growth of an InGaN well layer and a GaN barrier layer were repeated to form an active layer 3. For example, the growth temperature of the InGaN well layer which can emit green light is, for example, in a range from 700° C. to 750° C.

TMG, TMI and NH$_3$ were supplied to the reactor to grow an undoped InGaN layer 41 for an optical guide layer on an active layer 39 at a temperature of 840° C. The thickness of the undoped InGaN layer 41 was 50 nm. The composition of indium in the undoped InGaN layer 41 was 0.02. Next, TMG and NH$_3$ were supplied to the reactor to grow an undoped GaN layer 43 on the optical guide layer 41. The thickness of the undoped GaN layer 43 was 50 nm. Through these steps, the formation of the light emitting layer was complete.

Subsequently, in Step S204, a p-type gallium nitride based semiconductor region was grown on the light emission layer. The p-type gallium nitride based semiconductor region is formed, for example, by the steps described below. TMG, TMA, NH$_3$ and Cp$_2$Mg were supplied to the reactor to grow a Mg-doped AlGaN layer 45 on the GaN layer 43 at a temperature of 1100° C. The thickness of the AlGaN layer 45 was 20 nm. The composition of aluminum in the AlGaN layer 45 was 0.18.

TMG, TMA, NH$_3$ and Cp$_2$Mg were supplied to the reactor to grow a Mg-doped AlGaN layer 47 on the AlGaN layer 45 at a temperature of 1100° C. The thickness of the AlGaN layer 47 was 400 nm. The composition of aluminum in the AlGaN layer 47 was, for example, 0.06. In addition, TMG, NH$_3$ and Cp$_2$Mg were supplied to the reactor to grow a Mg-doped GaN layer 49 on the AlGaN layer 47 at a temperature of 1100° C. The thickness of the GaN layer 49 was 50 nm.

After forming the above-described laser structure, in Step S205, the NH$_3$ supply was stopped. Prior to the stop of the supply of NH$_3$ or immediately after the stop, the supply of nitrogen gas and monomethylamine (for example, at a flow rate of 1 sccm) was started. While these gases were supplied thereto, the susceptor temperature was decreased to 500° C. After this decrease of temperature, in Step S206, the supply of monomethylamine was stopped and the susceptor temperature was further decreased to room temperature while nitrogen gas was supplied to the reactor. Through these steps, an epitaxial wafer "B" was formed. In Step S207, the epitaxial wafer "B" was taken out from the reactor.

For comparison, immediately after the stop of the NH$_3$ supply, the susceptor temperature and substrate temperature were decreased for room temperature while supplying the nitrogen gas thereto. In this example, monomethylamine was not supplied to the reactor. Through these steps, an epitaxial wafer "D" was formed.

Electrodes were formed on both of the epitaxial wafers "B" and "D" without the annealing for activation. An anode 51*a* and cathode 51*b* were formed on the epitaxial wafer to produce a semiconductor laser diode as shown in FIG. 8. In Step S208, an electrode was formed as described below. The anode 51*a* was in electrical contact with the p-type GaN layer 49 through an insulating film 53 of a stripe window with a width of 10 p.m. The anode 51*a* was composed of Ni/Au and the cathode 51*b* was composed of Ti/Al/Au. An optical cavity was formed by cleavage in an a-plane.

A laser bar having a length of 600 µm was formed from the epitaxial wafer "C." The wavelength of lasing in response to the application of current was 460 nm. In addition, a laser bar having a length of 600 µm was formed from the epitaxial wafer "D." No lasing was observed when current was applied thereto.

Figure 6:
FIG. 6 is a view including atomic force microscope images of epitaxial wafers A and C.
Figure 6:

Through observation of the surface of the epitaxial wafer "D" with an atomic force microscope, many spiral irregularities and micro pits similar to Part (b) of FIG. 6 were found. This demonstrates that decreasing the temperature in the nitrogen atmosphere causes the decomposition of GaN and the formation of pits originated from the dislocations in GaN. It is thought that the diffusion of Mg dopant atoms through these pits deteriorates characteristics of the laser structure.

Although the activation of p-type dopant through a step of reducing the temperature using monomethylamine is described in the present embodiment, the activation can be achieved through a step of reducing the temperature using monoethylamine and a step of reducing the temperature using both monomethylamine and monoethylamine. While a semiconductor laser is described in the present embodiment, other stack structures for semiconductor optical devices such as light emitting diode structures have the same or similar advantages of the activation. Furthermore, while the activation for a semiconductor optical device is described in the present embodiment, this activation can be applied to gallium nitride based semiconductors containing a p-type dopant, such as gallium nitride based semiconductor devices (e.g. p-n junction diodes and field effect transistors) which need to break the bond between a p-type dopant and hydrogen. The present method can provide an excellent p-type gallium nitride based semiconductor region for a semiconductor optical device. In addition, the present method can provide a gallium nitride based semiconductor region having an excellent surface morphology on which an electrode can be formed.

Having described and illustrated the principle of the invention in a preferred embodiment thereof, it is appreciated by those having skill in the art that the invention can be modified in arrangement and detail without departing from such principles. The present invention is not limited to the specific configurations disclosed in the embodiments. Although the semiconductor optical device such as a semiconductor laser has been described by way of examples in the embodiments, the semiconductor devices may be electronic devices other than the semiconductor optical device. We therefore claim all modifications and variations coming within the spirit and scope of the following claims.

Reference Signs List

10: reactor;
11: substrate;
13: supporting base;
15: gallium nitride based semiconductor layer;
17: gallium nitride based semiconductor layer doped with p-type dopant;
17*a*: p-type gallium nitride based semiconductor;
E: epitaxial wafer;
A, C: epitaxial wafer;
31: GaN wafer;
33: AlGaN layer doped with Si;
35: n-type GaN layer;
37: undoped InGaN layer;
39: active layer;
39*a*: GaN layer;
39*b*: InGaN layer;
41: undoped InGaN layer;
43: undoped GaN layer;
45: AlGaN layer doped with Mg;
47: AlGaN layer doped with Mg;
49: GaN layer doped with Mg;
B, D: epitaxial wafer;
51*a*: anode;
51*b*: cathode.

The invention claimed is:

1. A method of forming a p-type gallium nitride based semiconductor, the method comprising the steps of:
   supplying a source gas to a reactor to grow a gallium nitride based semiconductor region at a growth temperature by metal-organic chemical vapor deposition, the source gas containing a p-type dopant, and the gallium nitride based semiconductor region being doped with the p-type dopant;
   after growing the gallium nitride based semiconductor region, supplying gas to the reactor to form an atmosphere in the reactor, the gas containing at least one of monomethylamine and monoethylamine; and
   exposing the gallium nitride based semiconductor region to the atmosphere at a substrate temperature in the reactor.

2. The method according to claim 1, wherein the substrate temperature is lower than the growth temperature.

3. The method according to claim 1, wherein hydrogen gas is not supplied in the step of exposing the gallium nitride based semiconductor region.

4. The method according to claim 1, wherein $NH_3$ is not supplied in the step of exposing the gallium nitride based semiconductor region.

5. The method according to claim 1, wherein a molar ratio of the supplied at least one of monomethylamine and monoethylamine to a total flow is 3% or less in the step of exposing the gallium nitride based semiconductor region.

6. The method according to claim 1, wherein a molar ratio of the supplied at least one of monomethylamine and monoethylamine to a total flow is 0.00001% or more.

7. The method according to claim 1, wherein a partial pressure of the supplied at least one of monomethylamine and monoethylamine is 3 kPa or less.

8. The method according to claim 1, wherein a partial pressure of the supplied at least one of monomethylamine and monoethylamine is 0.01 Pa or more.

9. The method according to claim 1, wherein each of monomethylamine and monoethylamine has a water content of 50 ppm or less.

10. The method according to claim 1, wherein the p-type dopant comprises at least one of magnesium and zinc.

11. The method according to claim 1, wherein the atmosphere further comprises nitrogen in the step of exposing the gallium nitride based semiconductor region.

12. The method according to claim 1, wherein the gallium nitride based semiconductor region comprises at least one of GaN, AlGaN, InGaN and InAlGaN.

13. The method according to claim 1, wherein the exposed gallium nitride based semiconductor region has a hydrogen concentration and a p-type dopant concentration, the hydrogen concentration is less than the p-type dopant concentration, and a ratio of the hydrogen concentration to the p-type dopant concentration is less than 1.0.

14. The method according to claim 13, wherein the ratio is less than a ratio of a hydrogen concentration of the gallium nitride based semiconductor region to a p-type dopant concentration of the gallium nitride based semiconductor region.

15. The method according to claim 14, wherein the ratio is less than a value defined by A1/A2, where A1 is equal to $4.8 \times 10^{18}$ cm$^{-3}$, and A2 is equal to $6.4 \times 10^{18}$ cm$^{-3}$.

16. A p-type gallium nitride based semiconductor formed by the method according to claim 15.

17. A p-type gallium nitride based semiconductor formed by the method according to claim 1.

18. A method of forming a nitride semiconductor device comprising the steps of:
   supplying a source gas to a reactor to grow a semiconductor region on a substrate by metal-organic chemical vapor deposition, the source gas containing a p-type dopant, the semiconductor region comprising at least one gallium nitride based semiconductor layer, and the gallium nitride based semiconductor region being doped with the p-type dopant;
   after growing the gallium nitride based semiconductor region, supplying gas to the reactor to form an atmosphere in the reactor, the gas containing at least one of monomethylamine and monoethylamine; and
   exposing the gallium nitride based semiconductor region to the atmosphere at a substrate temperature in the reactor.

19. The method according to claim 18, wherein the gallium nitride based semiconductor region is formed using ammonia as a nitrogen source.

20. The method according to claim 18, further comprising a step of growing an active layer prior to growing the gallium nitride based semiconductor region, the active layer being composed of gallium nitride based semiconductor,
   the active layer being provided between the gallium nitride based semiconductor region and an n-type gallium nitride based semiconductor region,
   the active layer emitting light, and the light being emitted in response to charge injection from the gallium nitride based semiconductor region and the n-type gallium nitride based semiconductor region,
   the active layer comprising a well layer, and
   the well layer being grown at a growth temperature in a range of 700° C. to 750° C.

21. The method according to claim 18, further comprising a step of forming an electrode in contact with a surface of the gallium nitride based semiconductor region.

22. The method according to claim 18, further comprising a step of growing an active layer prior to growing the gallium nitride based semiconductor region, the active layer being composed of gallium nitride based semiconductor.

23. The method according to claim 22, wherein the nitride semiconductor device includes a laser diode.

24. A nitride semiconductor device formed by the method according to claim 23.

25. The method according to claim 22, wherein the nitride semiconductor device includes a light emitting diode.

26. A nitride semiconductor device formed by the method according to claim 25.

27. A nitride semiconductor device formed by the method according to claim 22.

28. A nitride semiconductor device formed by the method according to claim 18.

29. A method of forming an epitaxial wafer for a nitride semiconductor device, the method comprising the steps of:
   supplying a source gas to a reactor to grow a semiconductor region on a substrate by metal-organic chemical vapor deposition, the source gas containing a p-type dopant, the semiconductor region comprising at least one gallium nitride based semiconductor layer, and the gallium nitride based semiconductor region being doped with the p-type dopant;
   after growing the gallium nitride based semiconductor region, supplying gas to the reactor to form an atmosphere in the reactor, the gas containing at least one of monomethylamine and monoethylamine; and
   forming a step flow morphology in a surface of the semiconductor region in the atmosphere in the reactor.

30. The method according to claim 29, wherein the step flow morphology is observed with an atomic force microscope.

31. An epitaxial wafer formed by the method according to claim 30.

* * * * *